United States Patent [19]

Bill et al.

[11] Patent Number: 5,724,284
[45] Date of Patent: Mar. 3, 1998

[54] MULTIPLE BITS-PER-CELL FLASH SHIFT REGISTER PAGE BUFFER

[75] Inventors: Colin Stewart Bill, Cupertino; Ravi Prakash Gutala; Qimeng Derek Zhou, both of Sant Clara; Jonathan Shichang Su, Sunnyvale, all of Calif.

[73] Assignee: Advanced Micro Devices, Inc., Sunnyvale, Calif.

[21] Appl. No.: 669,116

[22] Filed: Jun. 24, 1996

[51] Int. Cl.$^6$ .................................................. G11C 11/34
[52] U.S. Cl. ........................... 365/185.2; 365/185.21; 365/189.05; 365/189.12
[58] Field of Search .................... 365/185.2, 185.21, 365/189.12, 189.05, 210, 240

[56] References Cited

U.S. PATENT DOCUMENTS

| | | | |
|---|---|---|---|
| 4,903,242 | 2/1990 | Hamaguchi et al. | 365/230.08 |
| 5,198,999 | 3/1993 | Abe et al. | 365/189.05 |
| 5,200,925 | 4/1993 | Morooka | 365/219 |
| 5,479,370 | 12/1995 | Furuyama et al. | 365/189.12 |
| 5,539,689 | 7/1996 | Aoki | 365/185.21 |

*Primary Examiner*—David C. Nelms
*Assistant Examiner*—H. Nguyen
*Attorney, Agent, or Firm*—Davis Chin

[57] ABSTRACT

A shift register page buffer for use in an array of multiple bits-per-cell flash EEPROM memory cells so as to render page mode programming and reading is provided. A sensing logic circuit (26,27) is used to selectively and sequentially compare array bit line voltages with each of a plurality of target reference cell bit line voltages. Shift register circuit (300) is responsive to the sensing logic circuit for sequentially storing either a low or high logic level after each comparison of the bit line voltages with one of the plurality of target reference voltages. Each of the shift register circuits is formed of series-connected latch circuits (302–308), each having inputs and outputs. A switching transistor (N5) is interconnected between the sensing logic circuit and the latch circuits and is responsive to a corresponding output of the latch circuits for selectively passing the logic signal from the sensing circuit means to the input of the latch circuits.

18 Claims, 5 Drawing Sheets

MULTIPLE BITS-PER-CELL FLASH SHIFT REGISTER PAGE BUFFER

BACKGROUND OF THE INVENTION

1. Field of the Invention

This invention relates generally to floating gate memory devices such as an array of flash electrically erasable programmable read-only memory (EEPROM) cells. More particularly, it relates to a shift register page buffer for use in an array of multiple bits-per-cell flash EEPROM memory cells so as to render page mode programming and reading.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "Flash" EPROM or EEPROM. In these conventional (single density) flash memory devices, a plurality of one-transistor flash EEPROM core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +12 volts applied thereto. These voltages produce "hot electrons" which are accelerated across the thin dielectric layer and onto the floating gate. This hot electron injection results in an increase of the floating gate threshold by approximately two to four volts.

For erasing the flash EEPROM cell in conventional operation, a positive potential (e.g., +5 volts) is applied to the source region. The control gate is at a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level of approximately 50 to 100 uA. The programmed cell (storing a logic "0") will have considerably less current flowing.

In co-pending application Ser. No. 08/688,795 filed Jun. 24, 1996 and entitled "A Method for Multiple Bits-Per-Cell Flash EEPROM With Page Mode Program and Read" which is assigned to the same assignee as the present invention, there is illustrated and described a novel reading scheme for two bits-per-cell flash EEPROM memory cells in which the reference core cells were previously programmed to corresponding ones of a plurality of reference cell threshold voltages at the same time the memory core cells were programmed to one of a plurality of memory core threshold voltages. The reference core cells are embedded and associated with every page in the memory core array so that they can be concurrently programmed when the memory core cells are being programmed in parallel, e.g., 128 bytes at a time. A reading circuit responsive to a strobe signal is used to compare the memory cell threshold voltage of the selected memory core cell in a page with each of the reference cell threshold voltages so as to determine which one of the plurality of memory states the selected memory core cell is storing.

In co-pending application Ser. No. 08/635,995 filed Apr. 22, 1996 and entitled "A Method for Page Mode Programming Multiple Bits-Per-Cell Flash EEPROM" which is also assigned to the same assignee as the present invention, there is described the details of a unique programming technique for page programming simultaneously of the selected memory core cells and the reference core cells. A master bandgap voltage reference generator circuit is used to selectively generate one of a plurality of target memory core cell bit line program-verify voltages, each one corresponding to one of the programmable memory states. A switching circuit selectively connects a program current source to the array bit lines containing the selected memory core cells which are to be programmed. A sensing logic circuit compares continuously the potential on the array bit line with one of the target bit line program-verify voltages. The switching circuit disconnects the program current source so as to inhibit further programming when the potential on the bit line falls below the selected one of the plurality of target bit line program-verify voltages.

The page buffer of the present invention is utilized in the multiple bits-per-cell EEPROM memory cell array programming and reading techniques described in the aforementioned Ser. Nos. 08/688,795 and 08/635,995, which are hereby incorporated by reference. During the read mode of operation, the output of the latch driven by the sense amplifier of the read circuitry contains the stored information based upon the comparison of the array bit line voltage and a target reference cell bit line voltage. This stored information is later clocked into a shift register of the instant page buffer. During the programming mode of operation, program logic patterns corresponding to the desired programmable memory states are shifted serially into the shift register, which controls whether to allow programming of the selected memory cell or to inhibit programming of the same.

SUMMARY OF THE INVENTION

Accordingly, it is a general object of the present invention to provide a shift register page buffer for multiple bits-per-cell flash EEPROM cells which is relatively simple and economical to manufacture and assemble.

It is an object of the present invention to provide a shift register page buffer for use in an array of multiple bits-per-cell flash EEPROM memory cells so as to render page mode programming and reading.

It is another object of the present invention to provide a page buffer for use in an array of multiple bits-per-cell flash EEPROM memory cells which includes shift register means for sequentially storing either a low or high logic level after each comparison made by the sensing circuit means.

It is still another object of the present invention to provide a page buffer for use in an array of multiple bits-per-cell flash EEPROM memory cells which includes shift register means formed of series-connected latch means.

It is yet still another object of the present invention to provide a page buffer for use in an array of multiple bits-per-cell flash EEPROM memory cells which includes inhibit programming circuit means responsive to certain outputs of latch means for generating an inhibit logic signal so as to prevent programming.

It is still yet another object of the present invention to provide a page buffer with improved data input and output speeds, improved area due to the minimization of interconnects, and capability to render minimal added area cost with higher than two bits-per-cell operation.

In accordance with a preferred embodiment of the present invention, there is provided a page buffer for use in an array of multiple bits-per-cell flash EEPROM memory cells so as to render page mode programming and reading. A sensing circuit is provided for selectively and sequentially comparing bit line voltages with each of the plurality of reference voltages. A shift register circuit is responsive to the sensing circuit for sequentially storing either a low or high logic level after each comparison of the bit line voltages with one of the plurality of reference voltages. The shift register circuit is formed of a plurality of series-connected latch circuits, each having an input and an output. A switching circuit is interconnected between the sensing circuit and the latch circuits and is responsive to a corresponding one of the latch outputs for selectively passing the logic signal from the sensing circuit to the input of the latch means.

The shift register circuit includes an inhibit program circuit which is responsive to certain outputs of the latch means for generating an inhibit logic signal so as to prevent programming. During the programming mode of operation, the latch means are loaded with data corresponding to memory state regions to be programmed into the selected memory cells.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
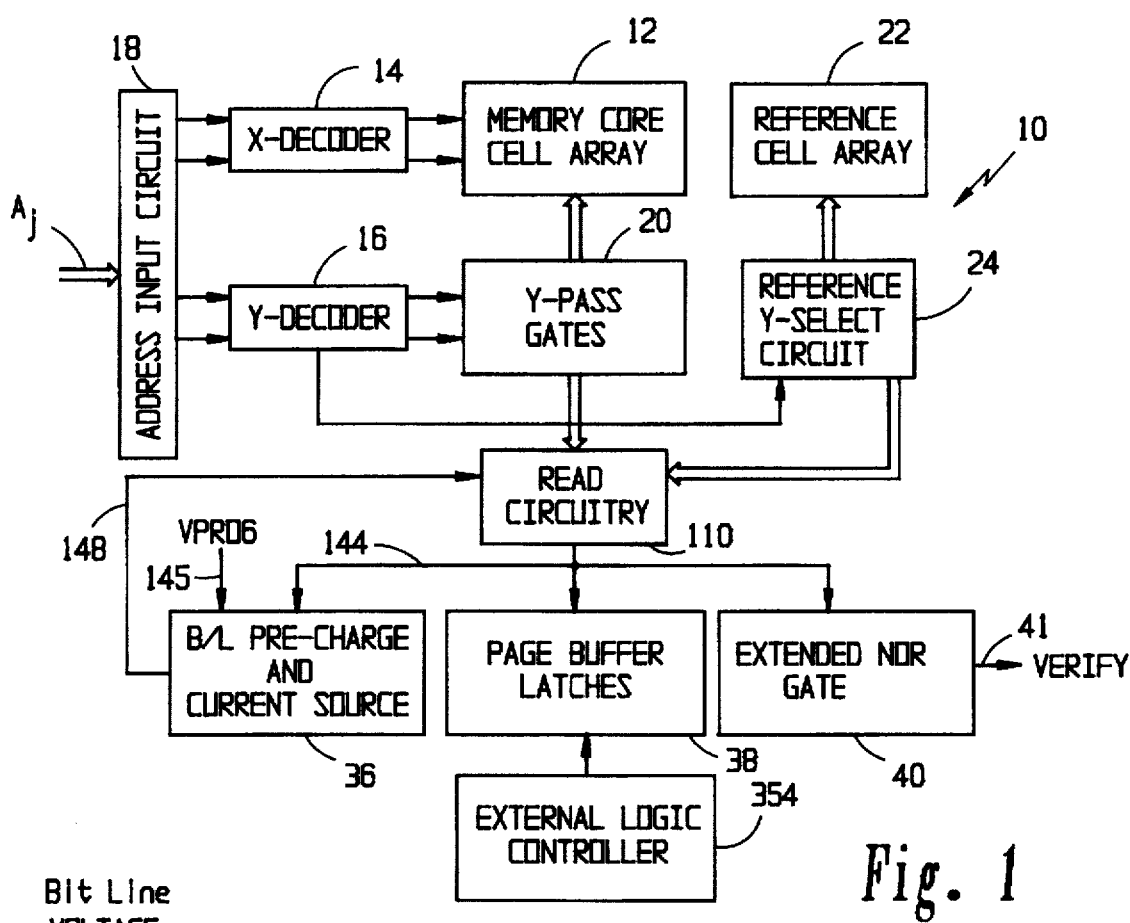
FIG. 1 is a block diagram of a multiple bits-per-cell semiconductor integrated circuit memory device having page buffer circuitry, constructed in accordance with the principles of the present invention.

Referring now in detail to the drawings, there is shown in FIG. 1 a block diagram of a multiple bits-per-cell semiconductor integrated circuit memory device 10 which includes a shift register page buffer so as to render page mode programming and reading operations in an array of multiple bits-per-cell flash electrically erasable read-only memory (EEPROM) cells of the memory device. The shift register page buffer 38 and the remaining portions of the memory device 10 are both wholly formed on a single semiconductor substrate by known CMOS integrated circuit technology.

The multiple bits-per-cell semiconductor integrated circuit memory device 10 includes a memory core cell array 12, a row address decoder 14, a column address decoder 16, an address input circuit 18, a Y-pass gate circuit 20, a reference cell array 22, a reference Y-select circuit 24, read circuitry 110, and a bit line pre-charge and current source circuitry 36. Address signals $A_j$ are applied externally to the address input circuit 18. The row address signals from the address input circuit 18 are fed to the row address decoder 14, and the column address signals thereof are fed to the column address decoder 16. The row address decoder 14 selects certain ones of the plurality of word lines in the memory core cell array 12 in response to the row address signals. The column address decoder 16 selects one of the pages in the memory core array in response to the column address signals as well as corresponding sets of reference columns associated with the selected page.

The details of the read circuitry 110 and associated components are described and illustrated in the aforementioned application Ser. No. 08/688,795. Further, the details of the bit line pre-charge and current source circuitry 36 and associated components are described and illustrated in the aforementioned Ser. No. 08/635,995. The page buffer 38 and extended NOR gate circuitry 40 of the present invention are utilized in conjunction with the programming and reading circuits and techniques in these previously mentioned applications. In particular, during the programming mode of operation the read circuitry contains the stored information based upon the comparison of the array bit line voltages and the target reference cell bit line voltages, which stored information is later clocked into shift registers of the instant page buffer. During the programming mode of operation, program logic patterns corresponding to the desired target program states are shifted serially into the shift registers of the page buffer, which controls whether to allow programming of the selected memory cells or to inhibit programming of the same.

Figure 2:
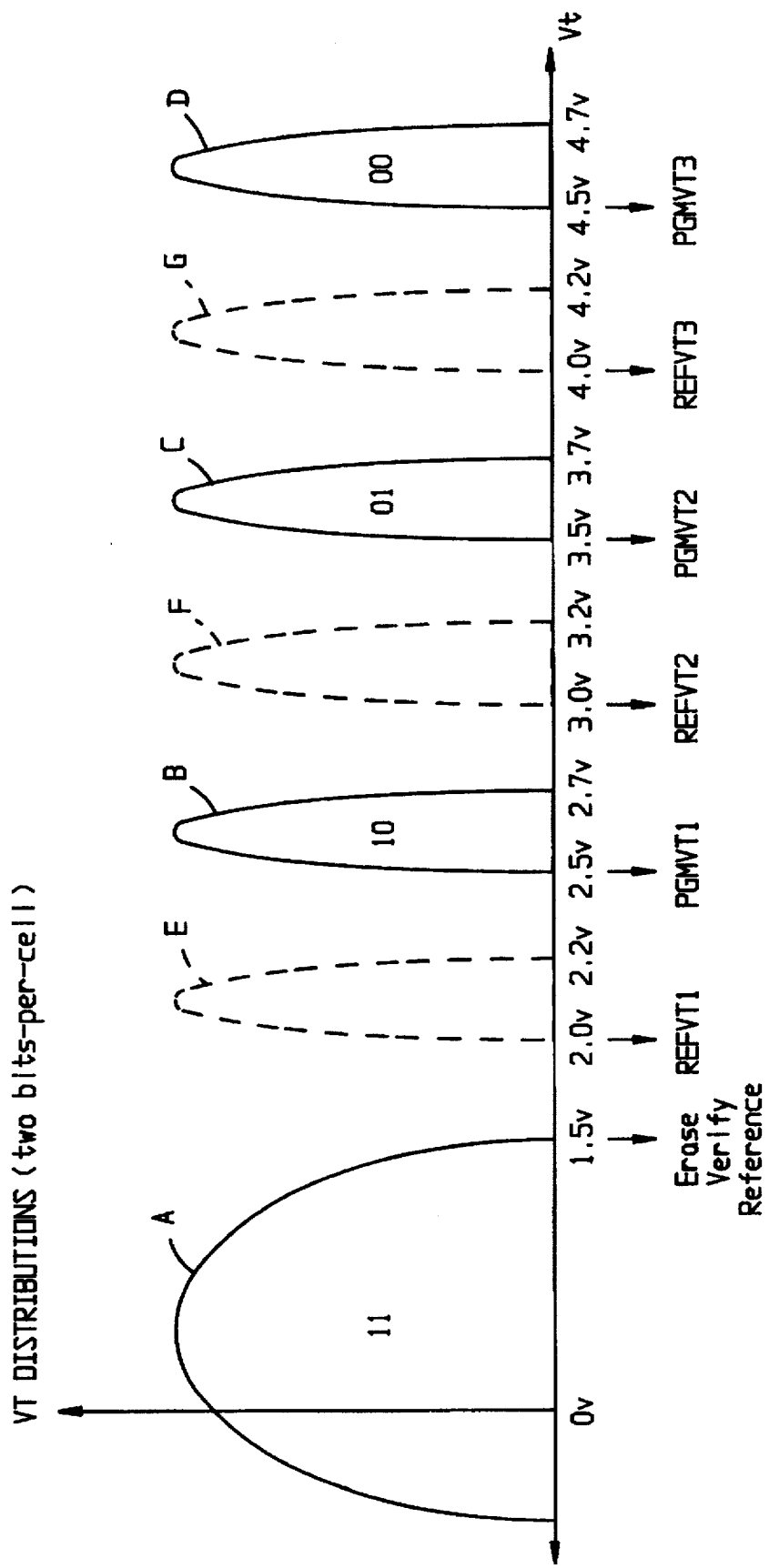
FIG. 2 illustrates the four memory state regions for a two bits-per-cell EEPROM memory cell which stores two bits of data per cell, there being three target reference cell threshold voltages and three target program threshold voltages.

In FIG. 2, there is shown a graph of the three reference cell threshold voltages REFVT1, REFVT2, and REFVT3 which serves to divide the programmable threshold range of a two bits-per-cell EEPROM memory cell into four memory state regions (one erased region and three programmable regions). The first or erased memory state region is referred to as logic pattern "11." The second or first programmable memory state region is referred to as logic pattern "10." The third or second programmable memory state region is referred to as logic pattern "01." Finally, the fourth or third programmable memory state region is referred to as logic pattern "00." Thus, the first reference cell threshold voltage REFVT1 separates the logic patterns "11" and "10." Similarly, the second reference cell threshold voltage REFVT2 separates the logic patterns "10" and "01." Lastly, the third reference cell threshold voltage REFVT3 separates the logic patterns "01" and "00."

Figure 3:
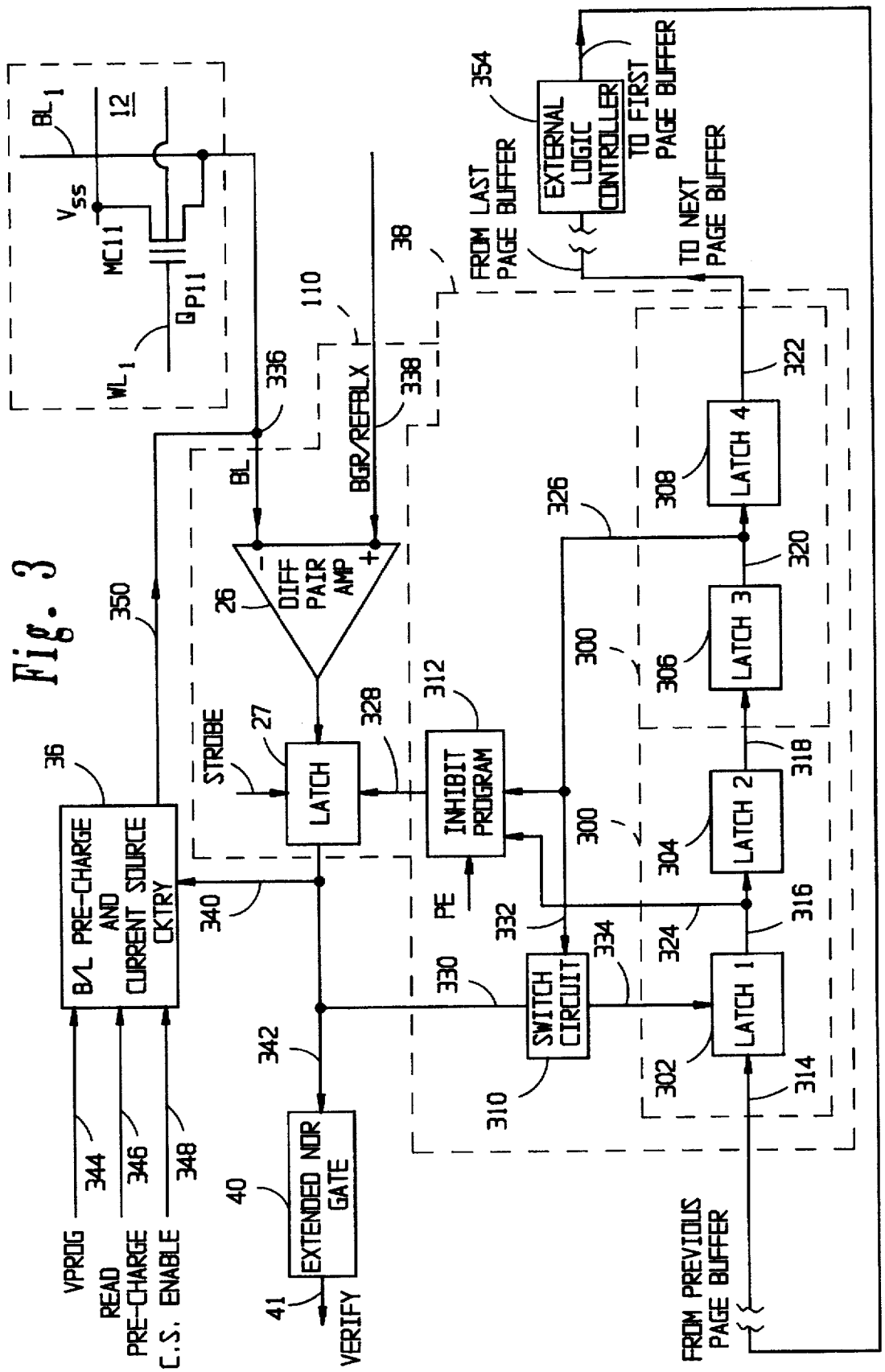
FIG. 3 is a simplified block diagram of the page buffer 38 of FIG. 1 and associated circuitry in the blocks 110, 36 and 40.

In FIG. 3, there is illustrated a simple block diagram of the shift register page buffer 38 of FIG. 1 and the portions of the associated circuitry in the read circuitry block 110, bit line pre-charge and current source circuitry block 36, and the extended NOR gate circuit block 40. The shift register page buffer 38 is comprised of two series-connected shift register elements 300, a switch circuit portion 310, and an inhibit program circuit portion 312. The first shift register 300 is formed of series-connected latches 302 and 304. Similarly, the second shift register 300 is formed of series-connected latches 306 and 308. A serial input data line 314 is used to connect the output of a preceding page buffer associated with an adjacent bit line to the input of the first latch 302 in the first shift register 300. The output of the first latch 302 on line 316 is connected to the input of the second latch 304 whose output on line 318 is connected to the input of the third latch 306. The output of the third latch 306 on line 320 is connected to the input of the fourth latch 308. A serial output data line 322 is used to connect the output of the fourth latch 308 to the input of a next succeeding page buffer associated with an adjacent bit line.

The inhibit program circuit portion 312 has a first input on line 324 connected to the output of the first latch 302 and a second input on line 326 connected to the output of the third latch 306. The output of the inhibit program circuit is connected via line 328 to another input of the latch 27 in the read circuitry 110. The switch circuit portion 310 has a first terminal on line 330 connected to the output of the latch 27 and a second terminal on line 332 connected also to the output of the third latch 306. The switch circuit portion 310 has a third terminal on line 334 which is connected to a second input of the first latch 302.

The read circuitry 110 contains the differential pair amplifier 26 and the latch 27. The differential amplifier 26 has its inverting input connected to a node 336 and to the bit line BL from the memory core cell array 12 and its non-inverting input connected to a line 338 for receiving either a bandgap derived reference voltage BGR or the reference bit line voltage REFBLX. The output of the differential pair amplifier 26 is fed to the input of the latch 27 whose output defines the output of the read circuitry 110. The output of the latch 27 is fed via line 340 to the input of the bit line pre-charge and current source circuitry 36, via the line 330 to the input of the page buffer 38, and via line 342 to the input of the NOR gate circuitry 40. The current source circuitry 36 has a first input on line 344 for receiving the program high voltage VPROG, a second input on line 346 for receiving a read voltage, and a third input on line 348 for receiving a current source enable voltage. The output of the current source circuity 36 is on line 350 which is fed to the inverting input of the differential pair amplifier 26 via the node 336. The NOR gate circuitry 40 is used for generating a signal VERIFY on line 41 which goes to a high logic level when the whole page has been verified.

Figure 4A:
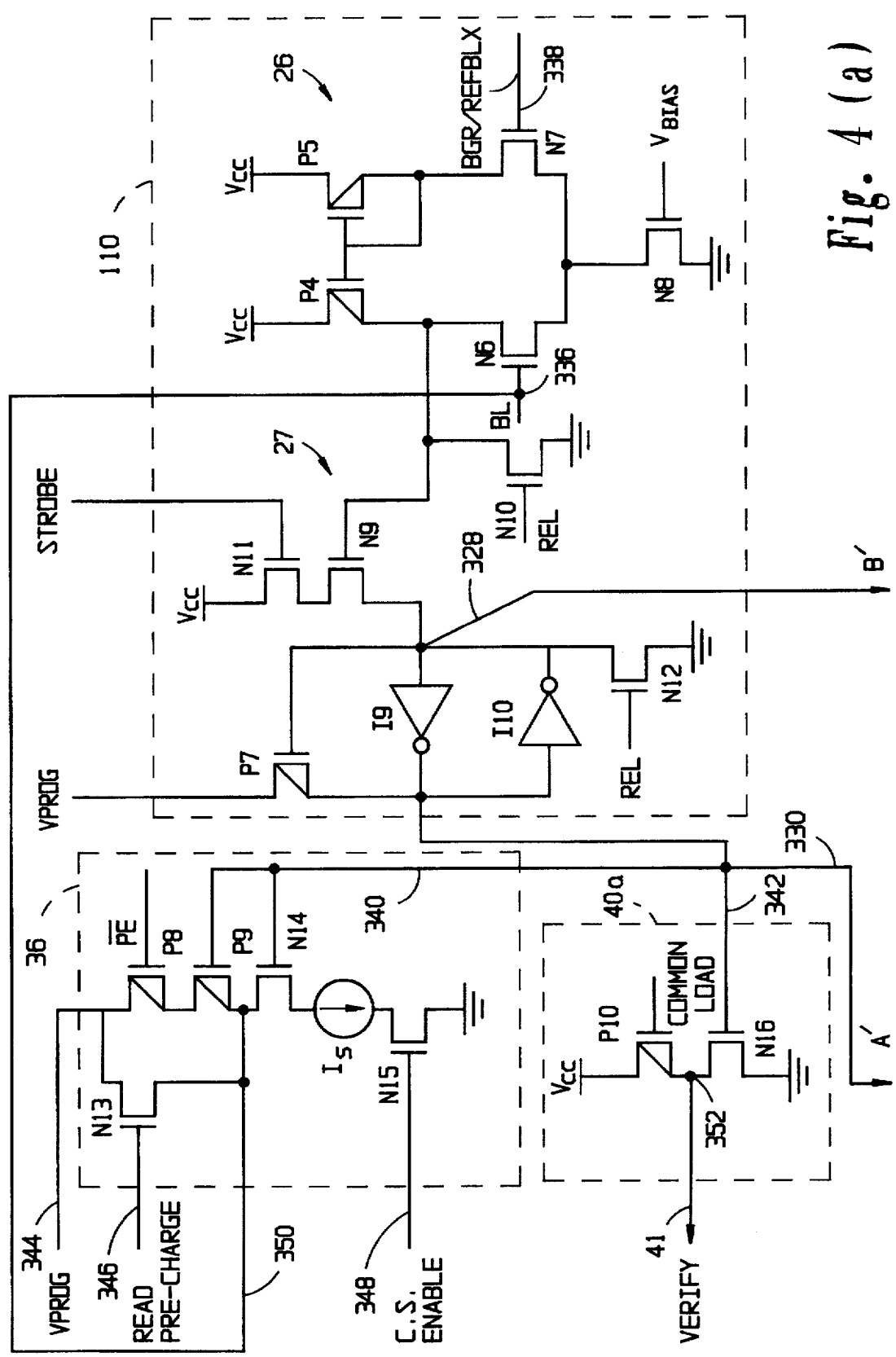
FIGS. 4(a) and 4(b), when connected together, is a detailed schematic circuit diagram of the various blocks in FIG. 3.
Figure 4B:
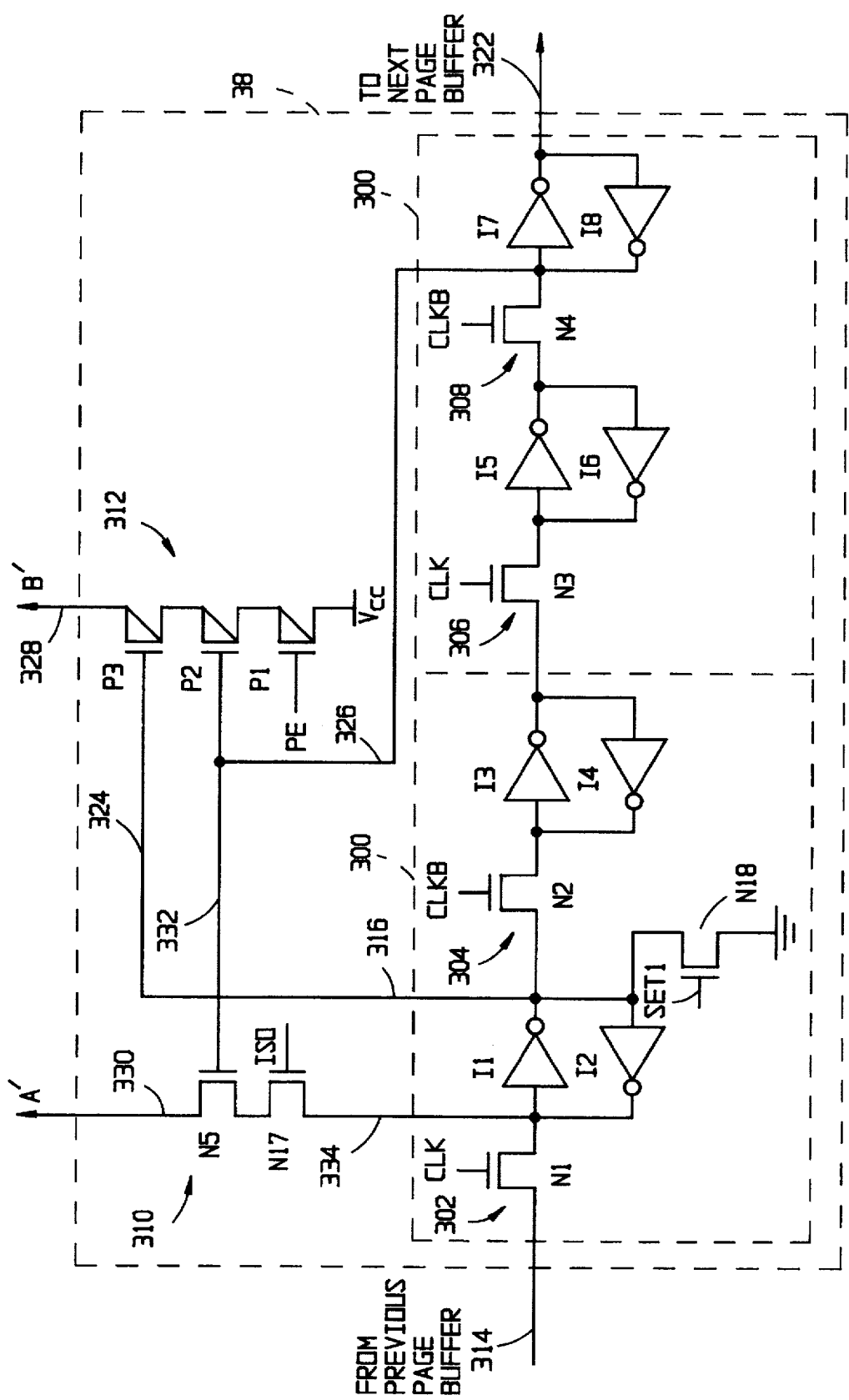

With reference now to FIGS. 4(a) and 4(b) of the drawings, there is shown a detailed schematic circuit diagram of the page buffer 38 of the present invention which is coupled to the associated blocks 110, 36 and 40 of FIG. 3. As can be seen, the first latch 302 is formed of a pass transistor N1 and a pair of cross-coupled inverters I1 and I2. The second latch 304 is formed of a pass transistor N2 and a pair of cross-coupled inverters I3 and I4. Similarly, the third latch 306 is formed of a pass transistor N3 and a pair of cross-coupled inverters I5 and I6, and the fourth latch 308 is formed of a pass transistor N4 and a pair of cross-coupled inverters I7 and I8.

The inhibit program circuit portion 312 includes three series-connected P-channel transistors P1, P2 and P3 connected between the power supply potential VCC and the line 328 which is connected to the input of the latch 27. The transistor P1 has its source connected to the power supply potential VCC, its gate connected to a program enable signal PE and its drain connected to the source of the transistor P2. The transistor P2 has its gate connected to the input of the inverter I7 and its drain connected to the source of the transistor P3. The drain of the transistor P3 is connected to the line 328. The switch circuit portion 310 is formed of an N-channel transistor N5 having its drain/source conduction path connected between the output of the latch 27 (line 330) and the second input of the first latch 302 (line 334). The gate of the transistor N5 is connected to the input of the inverter I7.

The differential pair amplifier 26 includes load P-channel transistors P4, P5; input N-channel transistors N6, N7; and a current source transistor N8. The gate of the input transistor N6 is connected to receive the voltage on the bit line BL, and the gate of the input transistor N7 is connected to receive the reference voltage BGR/REFBLX. The gate of the transistor N8 is connected to a bias voltage $V_{BIAS}$. The latch 27 is comprised of a pair of cross-coupled inverters I9 and I10; P-channel transistor P7; and N-channel transistors N9–N12. The bit line pre-charge and current source circuitry 36 includes P-channel transistors P8, P9; N-channel transistors N13–N15; and a 5 μA current source $I_S$. The gate of the transistor N14 defining the input of the current source circuitry 36 on the line 340 is connected to the output of the latch 27. The drain of the transistor N14 is connected to the line 350 defining the output of the current source circuitry 36. The source of the transistor P8 is connected to the program high voltage VPROG, and the gate of the transistor N15 is connected to the line 348 for receiving the current source enable signal.

The extended NOR gate circuit block 40 is comprised of a plurality of identical verify circuits 40a, one of which is shown in detail. Each of the verify circuits 40a includes series-connected pull-up transistor P10 and pull-down transistor N16. The pull-up transistor P10 has its source connected to the power supply potential VCC, its gate connected to a common load signal, and its drain connected to the drain of the pull-down transistor N16. The gate of the transistor N16 is connected to the output of the latch 27 via the line 342, and the source thereof is connected to the ground potential. The common node 352 of the transistors P10 and N16 is connected to all of the other common nodes in the plurality of verify circuits 40a so as to place them in a parallel arrangement. The common node 352 is further connected to the output line 41 so as to produce the signal VERIFY.

The operation of the page buffer 38 in FIGS. 3 and 4 for use with the two bits-per-cell memory core cell array 12 during a read mode will now be described with reference to FIG. 2. For the purposes of illustration, it will be assumed that it is desired to read the memory core cell $MC_{11}$ which has been previously programmed to the third programmable memory state region (logic pattern "00"). Further, it is assumed that the associated reference core cells in the reference cell array 22 have been programmed simultaneously to their respective reference cell threshold levels REFVT1, REFVT2 and REFVT3, as shown in FIG. 2, at the same time when the memory core cell $MC_{11}$ was being programmed. The simultaneous programming of the memory core cells and the reference core cells is described and illustrated in the aforementioned application Ser. No. 08/638,995.

Initially, the outputs of all of the latches 302–308 of the shift registers are set to zero. Then, the read signal READ on the gate of the transistor N13 will be made high so as to precharge all of the bit lines BL to the same potential (i.e., +1.5 V) prior to the start of the read mode. It should be noted that the program high voltage VPROG will be set equal to the power supply potential VCC during the read mode. The read operation is described and illustrated in the aforementioned application Ser. No. 08/688,795.

During a first read operation, the second reference threshold level REFVT2 programmed into the corresponding one of the associated reference core cells is selected to be used as the reference voltage REFBLX defining a target reference cell bit line voltage on the line 338. Since the voltage on the bit line corresponding to the third programmable memory state region will be higher than the second reference threshold level REFVT2, the output of the differential pair amplifier 26 will be low and the output of the latch 27 will store a logic "1." The first read step serves to establish the most significant bit (MSB) of the logic pattern "00," and such bit is transferred by the transistor N5 being turned on (SR1B=1) into the first latch 302. Thus, the output of the inverter I1 will store a logic "0." Thereafter, the gate of the transistor N2 will receive the signal CLKB so as to shift the MSB from the output of the first latch 302 (inverter I1) to the output of the second latch 304 (inverter I3).

Next, a second read step operation is performed by initially precharging again all of the bit lines to the same potential prior to start of the second read mode. Further, the gate of the pass transistor N3 receives the signal CLK so as to further shift the MSB from the output of the second latch 304 to the output of the third latch 306 (inverter I5). During the second read step, the first reference threshold level REFVT1 programmed into the corresponding one of the associated reference core cells is selected to be used this time as the reference voltage REFBLX on the line 338. Since the bit line voltage corresponding to the third programmed memory state region will be higher than the first reference threshold level REFVT1, the output of the differential pair amplifier 26 will again be low and the output of the latch 27 will store a logic "1." Again, the output of the latch 27 is transferred into the first latch 302 by the transistor N5. Thus, the output of the inverter I1 will store a logic "0." Thereafter, the gate of the pass transistors N2 and N4 will receive the signal CLKB so as to shift the MSB from the output of the third latch 306 (inverter I5) to the output of the fourth latch 308 (inverter I7) and to shift result of the second read step stored in the first latch to the second latch.

Finally, a third read step is performed by initially precharging once again all of the bit lines to the same potential prior to the start of the third read mode. During this third read step, the third reference threshold level REFVT3 programmed into the corresponding one of the associated reference core cells is selected to be used this time as the reference voltage REFBLX on the line 338. Since the bit line voltage corresponding to the third programmed memory state region will be higher than the third reference threshold level REFVT3, the output of the differential pair amplifier 26 will be low and the output of the latch 27 will store a logic "1."

However, it will be understood that the result of the third read data is only transferred to the first latch if the MSB is "0" (output of I7) which means SR1B=1. If SR1B=1, then the switching transistor N5 will remain conducting during the third read step and the third read data will be transferred and stored into the first latch 302. Otherwise, if SR1B=0, then the switching transistor N5 is non-conducting and the third read data is ignored. In this present example, the MSB is "0" and thus the third read step data will be stored in the first latch 302.

Lastly, the least significant bit (LSB) is shifted from the first latch 302 to the second latch 304. The outputs of the first and second latches 302, 304 will be storing the LSB, and the outputs of the third and fourth latches 306, 308 will be storing the MSB. The data or logic pattern "stored in the latches" will be shifted serially out from the shift registers via the serial data output line 322 after the whole page has been read.

Figure 5:
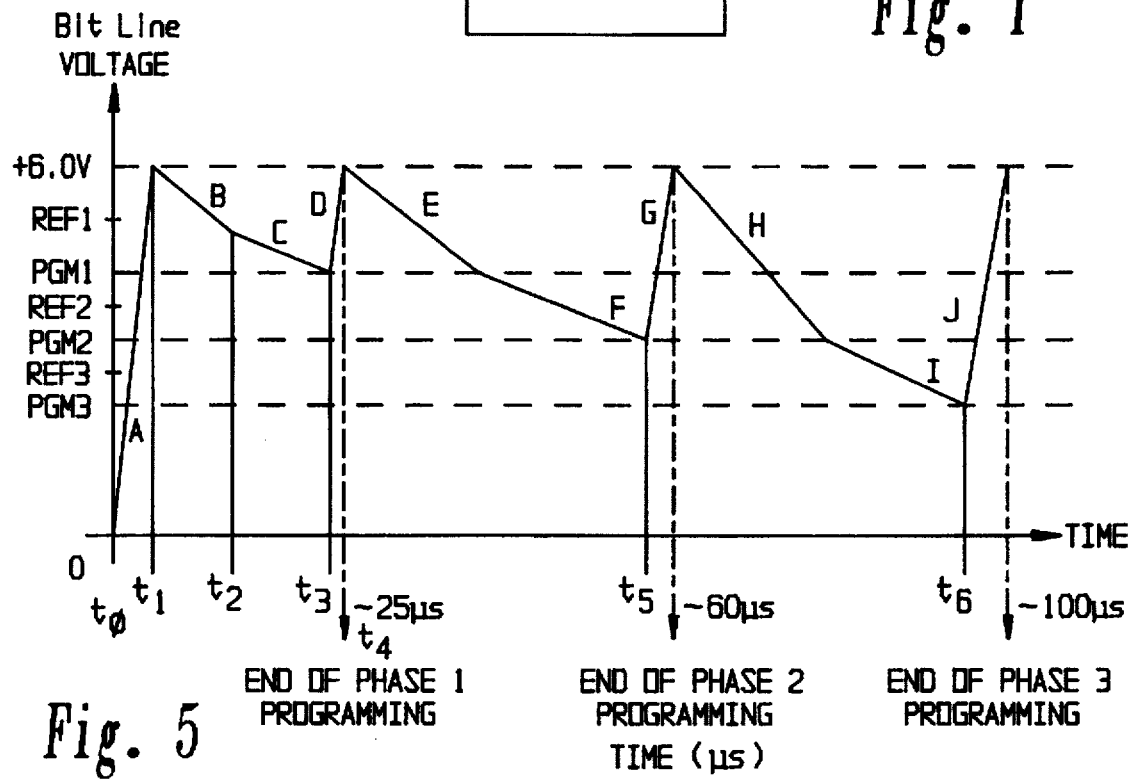
FIG. 5 is a graph of the bit line voltage as a function of the programming time corresponding to the three programmed states B, C, and D of FIG. 2, useful in understanding the programming operation of the present invention.

The operation of the page buffer 38 of FIGS. 3 and 4 for use with the two bits-per-cell memory core array 12 during a program mode will now be described with reference to FIGS. 2 and 5. For the purposes of illustration, it will be assumed that it is desired to program the memory core cell $MC_{11}$ to the third programmed memory state region (logic pattern "00") which is defined by a third programmed memory state PGM3.

Initially, the signal SET1 on the gate of the transistor N18 is made high. The logic "0" at the output of the inverter I1 is passed through to the input of the inverter I7 by clocking the signals CLK and CLKB. This causes the output of the latch 27 on the line 340 to go low ("0"). As a result, the corresponding bit line BL on the page is pre-charged by the program inhibit high voltage VPROG (approximately 5–6 V) via the transistors P8 and P9. At the same time, the common array ground line VSS is also charged to the same high voltage. Then, a page of data to be programmed is loaded serially into the page buffers 38 associated with the bit lines in the page through the serial input data line 314. Thus, in the present example the first and second latches 302, 304 are loaded with "0," and the third and fourth latches are also loaded with "0." Then signal REL will go high so as to cause the output of the latch 27 to go high ("1"). Consequently, the current source will be switched on due to the conduction of the transistor N14.

During a first program step operation, the programming will begin when the voltage on the word line $WL_1$ is charged up to the voltage VPP. However, if the page buffer 38 is loaded with "11" data (the outputs of the inverters I3 and I7) corresponding to the erased memory state region, then the inhibit programming circuit 312 will cause the output of the latch 27 to be switched to the logic "0" corresponding to a verified state. Accordingly, the current source will be turned off and no programming will occur. On the other hand, if the data loaded into the page buffer is in one of the programmed memory state regions (i.e., "10," "01," or "00") then an external logic controller 354 will cause the first target program memory state level PGM1 to be set or applied as the reference voltage BGR to the gate of the input transistor N7. Thus, the memory cell $MC_{11}$ will be charging or programming until the bit line voltage falls below the first reference memory programmed state level PMG1. At that time, the output of the differential pair amplifier 26 will go high and the output of the latch 27 will be switched to a logic "0," thereby turning off the current source $I_S$ and charging the bit line back to the program high voltage VPROG. This is the program inhibit state.

After all of the bit lines in the page, that are to be programmed to the first programmed memory state region (logic pattern "10"), are programmed then the output of the NOR gate circuit 40a will provide the signal VERIFY=1. The memory cells that are not required to be programmed beyond the first reference programmed memory state are inhibited. This occurs after the external logic controller 354 has caused the shift registers to be loaded with a next set of data in accordance with the Table listed below. The new data listed in the Table is generated by clocking out serially the entire contents of the page buffer shift register bit-by-bit, passing the data through the external logic controller 354, and reentering the data bit-by-bit back into the page buffer shift register. The data of "11" means that programming is to be inhibited. Any other pattern data means that programming is allowed to continue up one more level.

TABLE

| Desired Programmed Memory State Level | Program Step No. 1 | Program Step No. 2 | Program Step No. 3 |
|---|---|---|---|
| Erased | 11 | 11 | 11 |
| PGM1 | 10 | 11 | 11 |
| PGM2 | 01 | 10 | 11 |
| PGM3 | 00 | 01 | 10 |

In the present example, the external logic controller 354 will cause the second reference programmed memory state level PGM2 to be applied as a reference voltage BGR to the gate of the transistor N7. Thereafter, the memory cell $MC_{11}$ will continue to program until the bit line voltage falls below the second reference program memory state level. At that time, the latch 27 will again be switched to a logic "0" in order to switch off the current source and further programming. The bit line voltage will again be charged back to the program inhibit high voltage VPROG. After all of the bit lines in the page that are to be programmed to the second program memory state region (logic pattern "01"), then the output signal VERIFY on the line 41 will go high. The memory cells that are not required to be programmed beyond the second level are inhibited.

Finally, the external logic controller 354 will load the shift register with the next set of data (i.e., logic "10") which causes the third reference program memory state level PGM3 to be applied as the reference voltage BGR to the gate of the input transistor N7. Consequently, the memory cell $MC_{11}$ will continue to program until the bit line voltage falls below the third reference programmed memory state level. At that time, the latch 27 will again be switched to a logic "0" in order to switch off the current source and inhibit further programming. The bit line will again be charged back to the program high voltage VPROG. Lastly, after all of the bit lines in the page that are to be programmed to the third program memory state region (logic pattern "00"), then the output signal VERIFY on the line 41 will go high. The signal ISO on the gate of the transistor N17 serves to isolate the shift register from the latch 27 during programming.

From the foregoing detailed description, it can thus be seen that the present invention provides a shift register page buffer for use in an array of multiple bits-per-cell flash EEPROM memory cells so as to render page mode programming and reading. A sensing logic circuit is provided for selectively and sequentially comparing the array bit line voltages with a plurality of target reference cell bit line voltages. A shift register circuit is responsive to the sensing circuit for sequentially storing either a low or high logic level after each comparison of the bit line voltages with each of the plurality of target cell bit line reference voltages. The shift register circuit is formed of series-connected latch circuits having inputs and outputs.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A page buffer for use in an array of multiple bits-per-cell flash EEPROM memory cells so as to render page mode programming and reading, said page buffer comprising in combination;

sensing logic means (26,27) for selectively and sequentially comparing array bit line voltages with each of a plurality of target reference cell bit line voltages;

shift register means (300) responsive to said sensing logic circuit means for sequentially storing either a low or high logic level after each comparison of the bit line voltages with one of the plurality of target reference cell bit line voltages, said shift register means being formed of series-connected latch means (302–308) each having inputs and outputs;

switching circuit means (N5) interconnected between said sensing logic circuit means and said latch means and being responsive to one of the latch means outputs for selectively passing, the logic signal from said sensing logic means to the input of said latch means; and inhibit programming circuit means (312) responsive to outputs of said latch means during a programming mode for generating an inhibit logic signal so as to cause the logic signal from said sensing logic circuit means to be at a low logic level, thereby preventing programming.

2. A page buffer as claimed in claim 1, wherein each of said latch means (302–308) is comprised of a first inverter and a second inverter, said first inverter having its input connected to the output of said second inverter and having its output connected to the input of said second inverter.

3. A page buffer as claimed in claim 2, wherein said switch means is comprised of a switching transistor (N5) having its drain connected to the output of said sensing logic circuit means, its source connected to the input of said latch means, and its gate connected to a corresponding output of said latch means.

4. A page buffer as claimed in claim 3, wherein said sensing logic circuit means is comprised of a differential pair amplifier (26) functioning as a comparator and a latch (27).

5. A page buffer as claimed in claim 4, wherein said comparator means has a first input coupled to receive the bit line voltages and a second input coupled to receive said plurality of target reference cell bit line voltages.

6. A page buffer as claimed in claim 5, wherein said comparator means is comprised of sense amplifier means.

7. A page buffer as claimed in claim 6, wherein said sense amplifier means has an inverting input defining the first input of said comparator means and a non-inverting input defining the second input of said comparator means, and an output, said latch having its input connected to the output of said sense amplifier means and an output for providing the logic signal.

8. A page buffer as claimed in claim 7, wherein the output of said latch is coupled to an output terminal for providing the logic signal.

9. A page buffer as claimed in claim 1, wherein said latch means are loaded with data corresponding to memory state regions to be programmed into the selected memory cells during the programming mode and further comprising external logic controller means (354) for selectively applying one of the plurality of target reference cell bit, line voltages.

10. A page buffer as claimed in claim 9, further comprising logic gating means (40) responsive to said logic signal for generating a verify signal when said sensing logic circuit means has completed comparison of the whole page.

11. A page buffer as claimed in claim 10, further comprising current source circuit means (36) for selectively connecting and supplying a program current source to the bit line when the output of said sensing logic circuit means is at the high logic level and for disconnecting the program current source when the output of said sensing logic circuit means is at the low logic level.

12. A page buffer for use in an array of two bits-per-cell flash EEPROM memory cells so as to render page mode programming and reading, said page buffer comprising in combination;

sensing logic means (26,27) for selectively and sequentially comparing array bit line voltages with each of a plurality of target reference cell bit line voltages;

shift register means (300) responsive to said sensing logic circuit means for sequentially storing either a low or high logic level after each comparison of the bit line voltages with one of the plurality of target reference cell bit line voltages, said shift register means being formed of first through fourth series-connected latch means (302–308) each having inputs and outputs;

switching circuit means (N5) interconnected between said sensing logic circuit means and said latch means and being responsive to the output of said third latch means for selectively passing the logic signal from said sensing logic means to the input of said first latch means; and inhibit programming circuit means (312) responsive to said outputs of said first and third latch means during a programming mode for generating an inhibit logic signal so as to cause the logic signal from said sensing logic circuit means to be at a low logic level, thereby preventing programming.

13. A page buffer as claimed in claim 12, wherein said sensing logic circuit means is comprised of a differential pair amplifier (26) functioning as a comparator and a latch (27).

14. A page buffer as claimed in claim 13, wherein said comparator means has a first input coupled to receive the bit line voltages and a second input coupled to receive said plurality of target reference cell bit line voltages.

15. A page buffer as claimed in claim 14, wherein said comparator means is comprised of sense amplifier means.

16. A page buffer as claimed in claim 12, wherein each of said latch means (302–308) is comprised of a first inverter and a second inverter, said first inverter having its input connected to the output of said second inverter and having its output connected to the input of said second inverter.

17. A page buffer as claimed in claim 16, wherein said switch means is comprised of a switching transistor (N5) having its drain connected to the output of said sensing logic circuit means, its source connected to the input of said latch means, and its gate connected to a corresponding output of said latch means.

18. A page buffer as claimed in claim 12, wherein said first through fourth latch means are loaded with data corresponding to memory state regions to be programmed into the selected memory cells during the programming mode and further comprising external logic controller means (354) for selectively applying one of the plurality of target reference cell bit line voltages.

\* \* \* \* \*

UNITED STATES PATENT AND TRADEMARK OFFICE
CERTIFICATE OF CORRECTION

PATENT NO. : 5,724,284
DATED : March 3, 1998
INVENTOR(S) : Colin S. Bill et al.

It is certified that error appears in the above-indentified patent and that said Letters Patent is hereby corrected as shown below:

Column 6, line 62, change "08/638,995" to

-- 08/635,995 --

Col. 8, line 67, change "reentering" to

-- re-entering --

Col. 10, line 65, delete ",".

Signed and Sealed this

Twenty-sixth Day of May, 1998

*Attest:*

BRUCE LEHMAN

*Attesting Officer*     *Commissioner of Patents and Trademarks*